United States Patent [19]
Bishop et al.

[11] Patent Number: 5,524,152
[45] Date of Patent: Jun. 4, 1996

[54] METHOD OF AND APPARATUS FOR OBJECT OR SURFACE INSPECTION EMPLOYING MULTICOLOR REFLECTION DISCRIMINATION

[75] Inventors: Robert Bishop, Newton Centre; Richard Damon, Arlington, both of Mass.

[73] Assignee: Beltronics, Inc., Newton, Mass.

[21] Appl. No.: 290,414

[22] Filed: Aug. 15, 1994

Related U.S. Application Data

[63] Continuation of Ser. No. 850,049, Mar. 12, 1992, abandoned.

[51] Int. Cl.⁶ .................................................. G06K 9/82
[52] U.S. Cl. ...................... 382/165; 382/274; 356/425
[58] Field of Search ........................ 348/86, 87, 91; 356/402, 416, 425; 382/164, 165, 191, 192, 274

[56] References Cited

U.S. PATENT DOCUMENTS

| | | | |
|---|---|---|---|
| 4,731,663 | 3/1988 | Kovalchick et al. | 382/8 |
| 4,991,970 | 2/1991 | Darboux et al. | 356/402 |
| 5,014,329 | 5/1991 | Rudak | 382/17 |
| 5,085,325 | 2/1992 | Jones et al. | 382/17 |

*Primary Examiner*—Joseph Mancuso
*Assistant Examiner*—Larry J. Prikockis
*Attorney, Agent, or Firm*—Rines and Rines

[57] ABSTRACT

A novel automatic inspection technique and apparatus is disclosed for differentiating differently colored regions of an object or surface (such as solid state wafers, printed circuit boards, or more general applications for distinguishing regions of one color from their neighboring or surrounding areas of different color), involving the use of at least a pair of separate detectors of light images (CCD cameras preferably) reflected from the object or surface and provided with optical filters of different colors corresponding to the differently colored regions of the object or surface; and an electronic filtering processing by multiplying the detector signals by different weighting coefficients selected to maximize the ratio between the filter responses to optimize signal contrast, and then linearly summing the multiplexed signals. Independence from wide light intensity variations and in color variations in the production or processing of the object is thereby obtained.

18 Claims, 3 Drawing Sheets

METHOD OF AND APPARATUS FOR OBJECT OR SURFACE INSPECTION EMPLOYING MULTICOLOR REFLECTION DISCRIMINATION

This application is a continuation of Ser. No. 07/850,049, filed Mar. 12, 1992.

The present invention relates generally to the automatic inspection of objects or surfaces from which light is reflected, as in image scanning, being more particularly, though not exclusively, directed to such applications as the inspection of defects in electronic circuit wafers and boards and the like.

BACKGROUND OF THE INVENTION

Considering first the exemplary or illustrative application to such defect inspection, numerous prior systems and techniques have been evolved for scanning such wafers, circuit boards or other surfaces and analyzing the images produced by reflecting light from such surfaces, including mask comparisons with desired or "good" pattern surfaces, and techniques for learning "good" pattern features and shapes and flagging unfamiliar shapes encountered during inspection scanning as disclosed, for example, in U.S. Pat. Nos. 4,589,140 and 4,893,346, developed by the common assignee herewith and as incorporated first in the Model B-2000 of Beltronics, Inc. of Massachusetts and more recently in the Nikon Model AI1020 of Nikon of Japan. Among the variants in the latter techniques, as described in said patents, is the use of coded light, including color coding, to distinguish transmitted from reflected light useful particularly with via or other holes or apertures in the circuit board or other object or surfaces being inspected.

More recently, a very different approach to inspection processes, particularly useful with wafers (and other types of surfaces or objects having similar types of characteristics), was applied in the Beltronics "Microscan" Model, using intelligent image shrink and expand technology to enable inspection of portions of the light-reflected images of the surfaces in the context of the nature or characteristics of the surrounding material of the surface, thus to provide increased inspection discrimination and reliability, as described in copending U.S. patent application Ser. No. 636,413, filed Dec. 31, 1990 for Method of and Apparatus for Geometric Pattern Inspection Employing Intelligent Image-Pattern Shrinking, Expanding and Processing to Identify Predetermined Features and Tolerances, now U.S. Pat. No. 5,119,434, issued Jun. 2, 1992.

All of the above systems, to one degree or another, have a certain measure of criticality in requiring uniformity or appropriate light illumination intensity for illuminating the surface or object to be inspected; and substantial variations in such illumination, invariably mitigate against the satisfactory operation of the inspection system and require careful adjustment and readjustment.

Underlying the present invention, however, is a discovery of a technique for remarkably obviating such problems and limitations, particularly where the surface or objects to be inspected are multicolored, as, for example, in such wafers where different component parts appear as of different colors and hues. The invention, indeed, not only renders the inspection system far less susceptible to operational problems resulting from light illumination intensity variations, as occur in prior art systems, but synergistically significantly improves the discrimination capability of the inspection process, as well.

OBJECTS OF THE INVENTION

It is thus a principal object of the invention to provide a new and improved method of and apparatus for the image processing inspection of multicolored surfaces and objects that obviate such prior art dependency on uniform light illumination intensity, or susceptibility to variations of such light intensity, and also provide significantly increased inspection discrimination.

A further object is to provide such a novel inspection apparatus that is particularly adapted for the inspection of solid state wafer surfaces and other objects having similar or analagous multicolor component portions.

Other and further objects will be explained hereinafter and are more particularly delineated in the appended claims.

SUMMARY

In summary, however, from one of its broader viewpoints, the invention embraces a method of automatically inspecting and differentiating differently colored regions of an object or surface illuminated by light reflected therefrom, that comprises, independently receiving and electronically detecting reflected light images of the object or surface at a plurality of separate locations; providing different optical color filtering of the images at each location to produce from the detecting, different signals corresponding to the different spectral characteristics of the respective filtering; multiplying each of the said signals by different weighting coefficients selected to optimize the signal contrast between different filtered colors; and linearly summing the multiplied signals to create an electronically filtered resultant signal of sufficient signal contrast range to provide color discrimination irrespective of wide variation in light intensity and in color variation in the production of the object or surface.

Preferred and best mode designs and details are later presented.

DRAWINGS

The invention will now be described with reference to the accompanying drawings, FIG. 1 of which is a combined block and circuit diagram illustrating the invention in a preferred form;

DESCRIPTION OF PREFERRED EMBODIMENTS(S)

Figure 1:
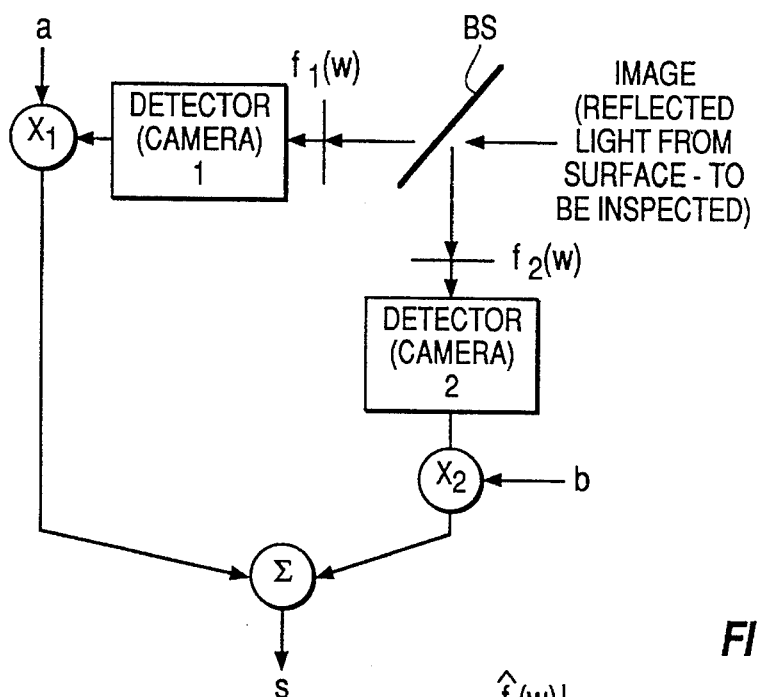

It is believed conducive to an understanding of the significant departure of the invention from prior general color filtering techniques heretofore used in a myriad of different applications for discriminating certain color reflections from objects, to explain the limitations of such approaches and the effect of illumination intensity variations and object color processing variations upon the same.
Limitations in General Optical Filtering and Signal Processing Techniques Conventional systems for analyzing multispectral or multicolored images, typically use color filters. The simplest system, for example, may discriminate between several colors by using a gray scale camera provided with a filter corresponding to a specific color that is to be detected, such that the output of that camera is high when the color of interest is present, and otherwise low. Depending upon the colors that are to be determined or distinguished, the choice of filters can either be very simple or very complex. If the colors are drastically different, for example blue and red, then the task is indeed simple. If, however, the colors are closer in spectral band, as for example, gold (primarily yellow) and pink (primarily red), and with overlap in color to some degree, as in some solid-state wafers where gold conductor lines that are to be inspected are on a multilayered substrate that appears to be pinkish or bluish in background, then the contrast obtainable by filtering out a basic red component may not be very great—perhaps only a 10% signal difference between the colors.

In human inspection of such a wafer, the eye and the brain will trace the gold conductor line(s), keeping in mind that the pink area around it is a non-conductor and not part of the electronic circuit. A machine that is going to inspect this gold line must be provided with a similar capability clearly to distinguish between the gold line and pink substrates in the vicinity around its area. With the before-described exemplary 10% signal contrast, or even 20% at best, a 10% (or 20%) variation in light intensity in the machine presents the dilemma that the machine cannot determine whether the reduced signal is due to the decrease in light or indeed represents a change from one color to another. From sample to sample, moreover, there are certain process or production manufacturing variations that give rise to variations in reflectivity of the specific color, and in the order of 10% to 20%, so that the machine again cannot distinguish between a variation of color or a variation in illumination, and would accordingly be incapable of adequately determining the gold from the pink region, thus forbidding reliable tracing of the conductor of interest.

Even where such prior approaches might suggest the use of multiple cameras and multiple filters, to try to optimize discrimination of a particular color(s), the problem remains that when the color differences are small, and illumination and color strengths may vary from sample to sample, the apparatus still cannot adequately and reliably determine from the electronic signals which signals are due to true differences in region or component surface portions or which are due to variations in process or production color or illumination.

General Approach of Invention

The approach of the present invention, which underlies its novel results, resides in the use of a substantially linear combination of weighted colors using multiple color-filtered cameras to create a new gray scale signal that is a linear combination of such multiple color cameras, wherein the color is used to enhance the gray scale information. While details are later explained, for present purposes it may be stated that, in the absence of noise, a 100% variation in light intensity may be introduced without affecting the ability to determine the difference in color between two regions such as the before-mentioned illustrative gold and pink wafer regions. These same regions, if a conventional camera and conventional filter approach were used, would only be able to tolerate a less than 10% (or at best 20%) variation in light or color difference, poignantly illustrating the power of the technique underlying the invention, and its extreme utility as an ideal pre-processor for inspection systems of a wide variety of types, including complex spatial and pattern match systems which analyze the specific regions.

Implementation

Referring to FIG. 1, a beam splitter BS is shown splitting the light from an illumination source (not shown) that has been reflected from the surface or object under inspection, into two paths—one path shown horizontally to a first detector 1, such as a CCD scanning-grey scale camera or the like, as of the types described in said patents, and vertically to a similar detector or camera 2 at a different Location. Each camera is fronted by a different color filter corresponding to different color segments or regions of the surface or object and represented by respective Legends $f_1(w)$ and $f_2(w)$. Optical filters, however, are limited in how sharply they can filter out other colors or frequencies (or wavelengths), and they have light transmission characteristics with the constraint represented by $0 \leq f(w) \leq 1$. The ideal or theoretical situation, of course, would be to have a spectral region with maximum 1, and all the rest of the frequencies would be 0; but the limited sharpness and requirement for sufficient passband to produce enough light energy to be detected (with the detector having a practical signal-to-noise ratio), do not enable such a result.

In accordance with the invention, the outputs of the respective detectors 1 and 2 are then weighted by appropriately selected multiplication coefficients a and b, later described, and the outputs of the two multipliers $x_1$ and $x_2$ are linearly summed at $\Sigma$ to produce a net or resultant signal S.

Mathematically, if $S(w)$ represents the light spectrum power as a function of color frequency (or wavelength), then the output of the multipliers, for maximizing the ratio between filter responses, may be respectively represented as $$M_1 = a f_1(w) S(w)$$

and $$M_2 = b f_2(w) P S(w); \tag{1}$$

and the output summation signal will be $$S = \int [a f_1(w) + b f_2(w)] S(w), \tag{2}$$

which may more simply be represented by $$S = \int f(w) S(w). \tag{3}$$

It should be noted that, by this technique, $f(w)$ is not constrained to be $0 \leq f(w) \leq 1$ as for an ordinary optical filter, as described above, but can be very freely chosen to maximize contrast based on color. Thus, what has really been done is to create an effective optical-electronic filtering and processing system that generates a new grey scale image given by expression (3), above, wherein practical optical filter constraints have been significantly relaxed (or increased) by making use of the color spectral information in the image in a more optimal manner.

To return, momentarily, to the comparison with ordinary filter techniques before discussed, assume that filter $f_1(w)$ is eliminated and the color filter $f_2(w)$ is used with camera 2 to discriminate that color in the image reflection. For regions of the illuminated object or surface with weak color absorption differences and low contrast, it was pointed out that illumination variations can make accurate discrimination decisions difficult. Whereas prior single filter discrimination, for a 10% change in contrast, would create a signal the output of which might vary from 0.9 to 1.0, the electronic filtering technique of FIG. 1 enables variation all the way from −1 to +1 depending upon the spectral color involved. In the case of no color whatsoever (i.e., a black range), the output would be zero. Because of the high contrast afforded by the technique of the invention, indeed, the illumination light intensity can vary tremendously, almost 100%, and the signal would still be reliably detected.

In actual practice, however, there is the real-world consideration of signal-to-noise ratio. In the prior conventional simple filtering, if one spectral region provides an output of 1, and another of 0.9, as previously discussed, a certain amount of noise, say 0.05, may be tolerated. In the presence of such noise, the 1 would be reduced to 0.95, and the 0.9 could increase again to 0.95, and the two would be indistinguishable and incapable of being discriminated or differentiated. The noise, thus, must be less than 0.05, or a signal-to-noise ratio of at least 20-to-1 available.

In the system of FIG. 1, however, if a 100% variation in light were demanded (which, of course, is extremely demanding and unrealistic), the system could actually achieve this, but a signal-to-noise ratio of about 43-to-1 would be required.

By using two different color filters $f_1(w)$ and $f_2(w)$, one at each of the separate detection locations of the cameras 1 and 2, in FIG. 1, however, it may be shown that with a signal-to-noise ratio of only 27-to-1 (comparable with the above-mentioned 20-to-1), a 100% variation in light will yield a range of +1 to −1 signals. This, however, is still not practical; and it is through the judicious selection of the before-mentioned weighting coefficients a and b, that the signal S may be optimized for the best tradeoff or compromise between practical signal-to-noise and tolerating a very large or comfortable range of lightness variation or color processing variation, with excellent contrast and color differentiation.

Determination of Weighting Coefficients

Figure 2:
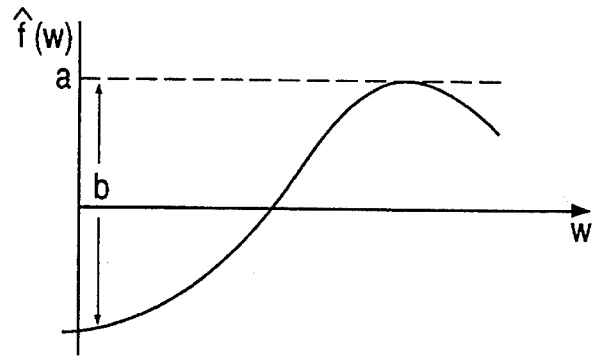
FIG. 2 is a graph of a processed resultant signal developed in accordance with the invention as a function of color frequency.

One of the distinct advantages of the invention resides in the fact that, unlike a conventional filter, the passband of which is limited by zero and 1, zero if it is not passing a specific color and 1 if it has 100% transmission, the electronic filter of the invention effectively is much more general. In fact, its gain can be negative and positive as a function of frequency, as shown in the electronic filter response of FIG. 2, plotting f(w) of equation (3) against color frequency w. The peak amplitude of the filter response has been assigned the magnitude a, and the difference between such peak and the minimum response value (i.e., the maximum difference), has been designated the value of −b. It is these coefficients a and b that serve as the multiplication coefficients for the respective multipliers $x_1$ and $x_2$ shown in FIG. 1.

Figure 3A:
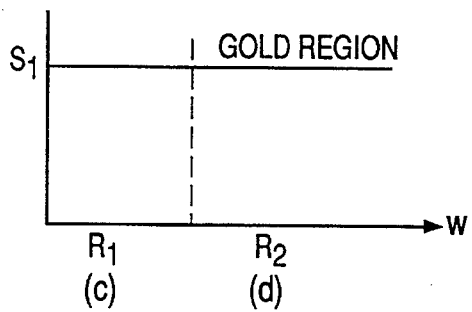
FIGS. 3A and 3B are also graphs of different spectral signal responses of differently colored regions of the object or surface under inspection.
Figure 3B:
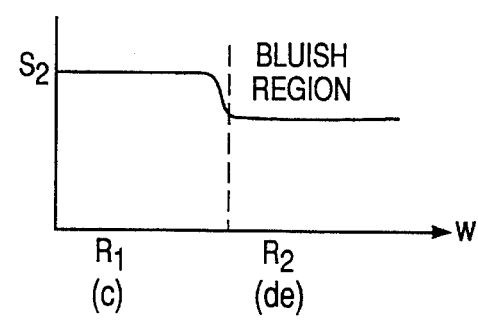

To illustrate how these coefficients are determined for the purposes of the invention, it is helpful to refer to the example of FIGS. 3A and 3B for the exemplary case of the spectral response for two colors of interest before discussed; gold, and a background which is blue or bluish in that, in the red part of the spectrum it has less red than the gold, tending to produce such bluish tint. Comparing FIGS. 3A and 3B, it will be noted that the spectral response in the band of lower frequencies $R_1$ is much like the spectral response for the gold. For higher frequencies, however, regions $R_2$, the bluish response has somewhat less gain than the gold, and this is thus the region that the spectral outputs for the gold and bluish regions of the object or surface differ.

If the similar value of the signal amplitudes in region $R_1$ of the gold and bluish regions of the object or surface be assigned the symbol c, and the magnitude in the higher color frequency region $R_2$ of the gold be represented by d, FIG. 3A, the reduced bluish region response in the region R of FIG. 3B may be represented as de, where e is the absorption or attenuation coefficient of the bluish region material; i.e., the same original amplitude detected in the gold region multiplied by such coefficient e of the bluish material. The virtual or electronic filter action desired for f(w) involves maximizing the difference in signals between $S_1$ of FIG. 3A and $S_2$ of FIG. 3B. This requires that the output in detecting the bluish region(s) be 1, as contrasted with the relatively small discrimination available by prior filter techniques (10%, for example) as before discussed. If the value of f(w) in the region $R_1$ be represented as $x_1$, and the value in region $R_2$ be represented as $x_2$, this gives rise to the following expressions:

For $S_1$, $cx_1 + dx_2 = -1$;

and

For $S_2$, $cx_1 + dex_2 = 1$.  (4)

Since c and d can be readily measured (that is, the signal output for reflection from the gold regions at lower and higher frequencies), and e is an attenuation coefficient that also can be measured and thus known, the respective values of $x_1$ and $x_2$ are readily determinable:

$$x_1 = \frac{1+e}{c(1-e)} \quad (5)$$

and $$x_2 = \frac{-2}{d(1-e)}$$

As an example, if the value of c and d is 1 and the attenuation coefficient e is 0.9, the equations (5) yield a filter response $x_1$ of 19 and a filter response $x_2$ of −20. The weighting coefficients required to implement the architecture of the invention have thus been determined; a being equal to the peak value of the filter response (19, as above determined), and b being equal to the difference between the negative peak of the filter and the positive peak value (−20−19=−39, as above determined).

Inserting these thusly determined weighting coefficients a and b in the system of FIG. 1 and equations (4), above, provides the desired signal $S_1$ for the gold color of −1 and the signal $S_2$ of 1 for the bluish color, with a delta of 2. Without the system of the invention, as previously explained $S_1$ may be 1 and $S_2$, 0.9. With a 10% decrease in the illumination of the surface or object being scanned, the prior art causes $S_1$ to reduce to 0.9 and $S_2$, to 0.8, which can readily create color confusion; whereas, with the present invention, $S_1$ reduces to 0.9 and $S_2$ to −0.9, providing what is believed to be a heretofore unparalleled wide range of detectable contrast and color differentiation —and this even if the light variation is as much as almost 100%, as before explained. Similar comments apply, as previously explained, to variations in color in the processing of the object or surface.

In the practical use of the technique of the invention, it is important that the images from the different filtered cameras be precisely aligned. This is readily effected through the use of overlapping hordes markers of the like.

Figure 4A:
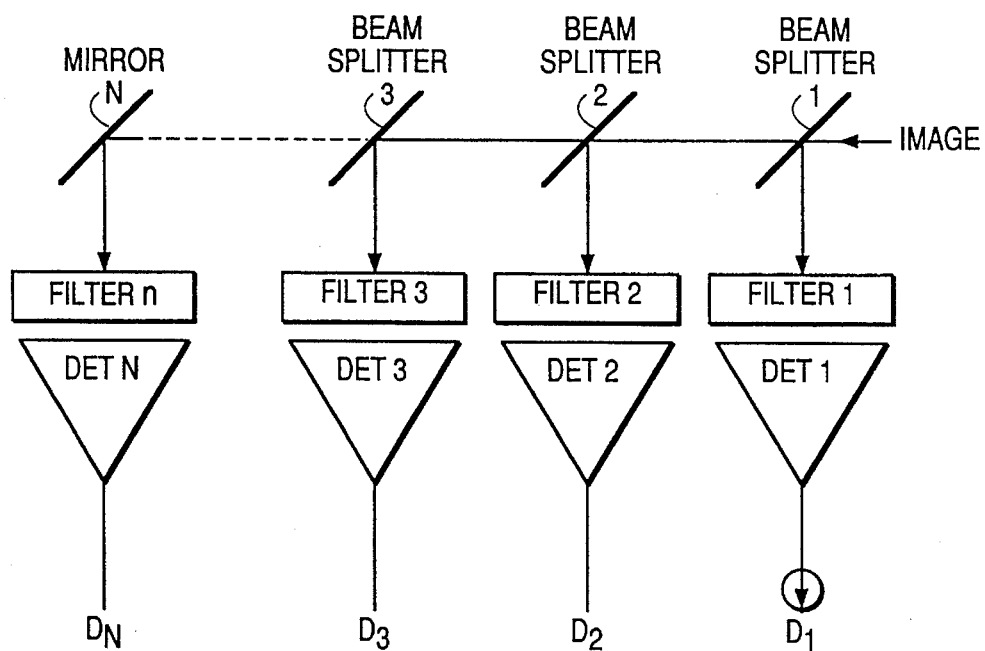
FIGS. 4A and 4B are diagrams similar to FIG. 1 of a more generalized multicolor discrimination system.
Figure 4B:
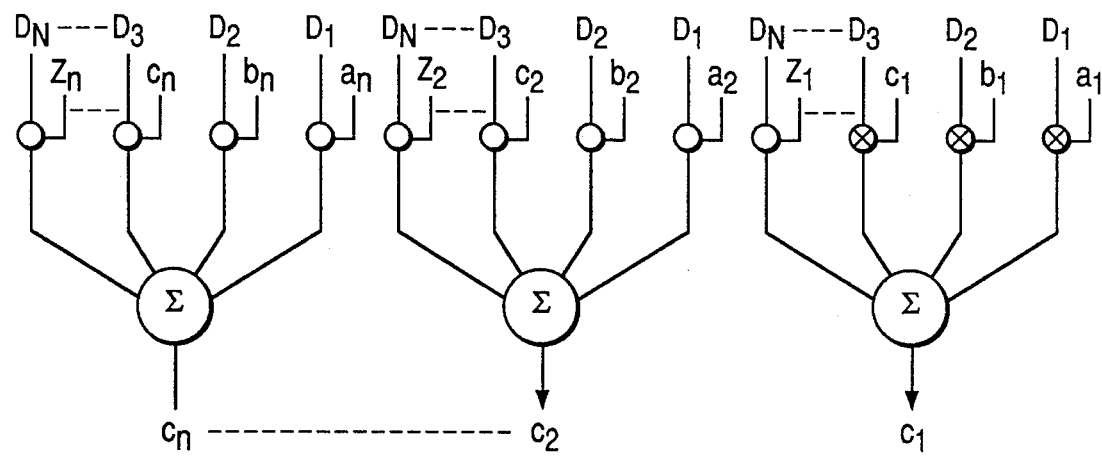

Though the invention has been illustratively described in terms of a two-color operation, it may be extended to other multicolor systems as well, as more generically described in connection with the embodiment of FIGS. 4A and 4B. The reflected image is these shown passed through a series of Beam splitters 1–N and thence through respective different colored Filters 1–N in front of corresponding cameras or detectors Det 1–N producing outputs $D_1$–$D_N$, FIG. 4A. In the same manner as explained in connection with the two-color system of FIG. 1, the best linear combination for detection discrimination for each color is sought by selection of appropriate respective weighting coefficients, such as $a_1$, $b_1$, $c_1 \ldots z_1$, for multiplying the corresponding signals $D_1 \ldots D_N$ for a first color, linearly summing all these to achieve a signal $C_1$, designed to have an optional or maximum output when considering the first color as in FIG. 4B, far right. In the same fashion, the outputs $D_1 \ldots D_N$ will be multiplied by appropriate weighting coefficients $a_2$, $b_2$, $c_2 \ldots z_2$ and summed (FIG. 4B, center) to give the optimal signal maximum output for a second color; and so on for the nth color, where weighting coefficients $a_2$, $b_2$, $c_2 \ldots z_2$ multiply the respective signals $D_1 \ldots D_N$ and sum them (FIG. 4B, left side) for the greatest output for the nth color. In such a case, a little more intelligence may be added in view of the fact that the sample is composed of $C_1, C_2 \ldots C_n$, such that the strongest color may represent the color of a specific region. This is because these signals have already been optimized with the weighting coefficients so that it is known, a priori, that for a given color, one output definitely dominates the others, identifying the desired region.

Figure 5:
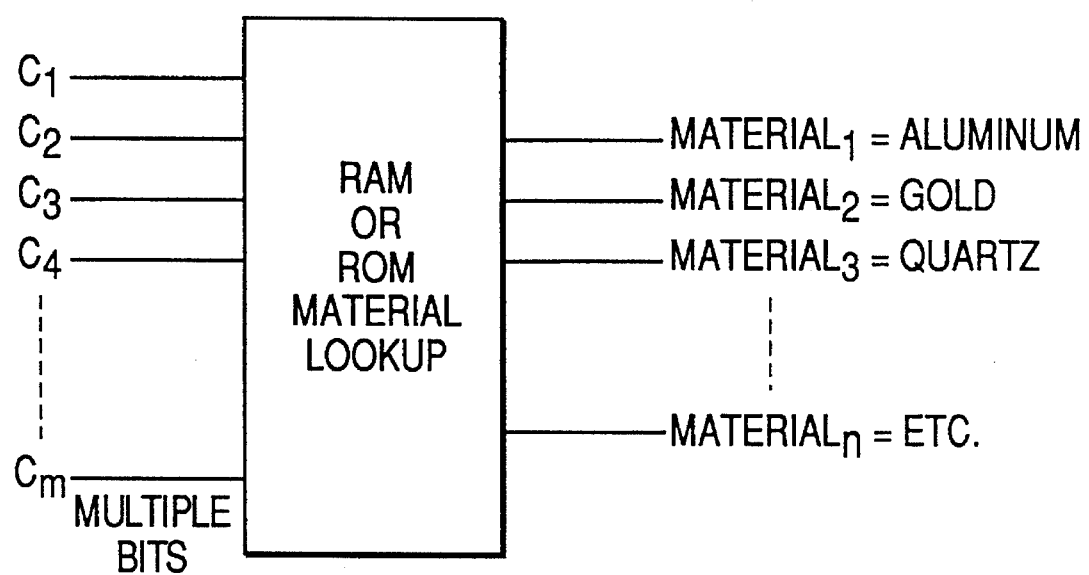
FIG. 5 is a block diagram of a circuit for identifying the material of the differently colored regions.

In more complex problems, signals $C_1$ through $C_n$ can be analyzed in combination to determine what material is present. For example, signals $C_1$ through $C_n$ can be digitized into multiple bits, if not in digital form already, and applied to the address lines of a random access memory RAM, or read only memory ROM, so-labelled in FIG. 5. The RAM or ROM can be programmed so that its output lines indicate or identify which material is present by storing in its memory which combinations of signals $C_1$ through $C_n$ correspond to specific material types, exemplarily shown as materials 1 . . . n, such as aluminum, gold, quartz, etc.

In the case of solid-state wafers, the various colors that are customarily encountered are the gold conductors, pink substrate areas and blue and yellow, representing different process areas in the semiconductor. There are relatively dense memories incorporated into the device that show these different colors. Successive layers may be examined, one at a time, choosing first the top layer of a given color and distinguishing or differentiating the same from neighboring colors. For use of the technique of the invention with circuit boards, the copper conductors return a somewhat gold-brown color, and the epoxy background is generally greenish, with solder on top of the copper appearing silvery. For the inspection machine applications, it is desired to measure the feature sizes, features being conductors, lines, etc., but such requires the ability to detect and distinguish the presence of those features. The present invention with its improvement in contrast during the multispectral or multicolored image electronic filtering during image scanning, specifically enhances the available contrast of those lines and hence enables improved measurement of the size and other characteristics.

As earlier stated, however, the invention is useful in the inspection of other types of multicolor objects and surfaces as well, including, in another illustrative application, food surface inspection where color discrimination may assist in quality control and/or in detecting spoilage (red proper-condition quality strawberries or tomatoes, with brown defect or aberration regions, for example). There are, of course, a myriad of other types of systems, as well, where it is required with high contrast and relative insensitivity to illumination or processing color variations to distinguish regions of one color from their neighboring, adjacent or surrounding areas of different color.

Further modifications will also occur to those skilled in this art, such being considered to fall within the spirit and scope of the invention as defined in the appended claims.

What is claimed is:

1. A method of automatically inspecting and differentiating differently colored adjacent regions of an object or surface illuminated by light reflected therefrom, that comprises, independently receiving and electronically detecting reflected light images of the object or surface at a plurality of separate locations; providing different optical color filtering of the images at each location to produce from the detecting, different signals corresponding to the different spectral characteristics of the respective filtering; multiplying each of the said signals by different weighting coefficients selected with coefficients of opposite positive/negative polarity for differently colored adjacent regions to optimize the signal contrast between different colors; and linearly summing the multiplied signals to create an electronically filtered resultant signal of sufficient signal contrast range to provide color discrimination irrespective of wide variation in light intensity and in color variation in the production of the object or surface.

2. A method as claimed in claim 1 and in which the image receiving and detecting is effected at two scanning cameras each optically filtered with a different color corresponding to a different region of the object or surface that reflects the light with that color; and the opposite positive/negative polarity weighting coefficient selection is effected to maximize the ratio between the responses of the filterings at the two cameras.

3. A method as claimed in claim 1 and in which the further steps are performed of identifying from said signals the material of the different inspected regions.

4. A method as claimed in claim 3 and in which said identifying is effected by storing combinations of said signals corresponding to special region materials and indicating the material in response to the detecting of such combinations of signals.

5. A method of automatically inspecting and differentiating differently colored regions of an object or surface illuminated by light reflected therefrom, that comprises, independently receiving and electronically detecting reflected light images of the object or surface at a plurality of separate locations; providing different optical color filtering of the images at each location to produce from the detecting, different signals corresponding to the different spectral characteristics of the respective filtering; multiplying each of the said signals by different weighting coefficients selected to optimize the signal contrast between different colors; linearly summing the multiplied signals to create an electronically filtered resultant signal of sufficient signal contrast range to provide color discrimination irrespective of wide variation in light intensity and in color variation in the production of the object or surface, and in which the image receiving and detecting is effected at two scanning cameras each optically filtered with a different color corresponding to a different region of the object or surface that reflects the light with that color; and the weighting coefficient selection is effected to maximize the ratio between the responses of the filterings at the two cameras, and in which the object is a solid state wafer the conductor region of which is of gold color and the surrounding region is selected from the group consisting of substantially pink, blue and yellow color; and the different color filtering is selected to correspond to the conductor region and at least one of the surrounding region colors.

6. A method of automatically inspecting and differentiating differently colored regions of an object or surface illuminated by light reflected therefrom, that comprises, independently receiving and electronically detecting reflected light images of the object or surface at a plurality of separate locations; providing different optical color filtering of the images at each location to produce from the detecting, different signals corresponding to the different spectral characteristics of the respective filtering; multiplying each of the said signals by different weighting coefficients selected to optimize the signal contrast between different colors; linearly summing the multiplied signals to create an electronically filtered resultant signal of sufficient signal contrast range to provide color discrimination irrespective of wide variation in light intensity and in color variation in the production of the object or surface, and in which the image receiving and detecting is effected at two scanning cameras each optically filtered with a different color corresponding to a different region of the object or surface that reflects the light with that color; and the weighting coefficient selection is effected to maximize the ratio between the responses of the filterings at the two cameras, and in which the object is a printed circuit board and the conductor region of which is of copper color and the surrounding region of which is of another color; and the different color filtering is selected to correspond to the conductor region and the surrounding region colors.

7. Automatic inspection apparatus for differentiating differently colored regions of an object or surface illuminated by light reflected therefrom having, in combination, a plurality of separate light image detector means, such as scanning cameras for producing electronic signals in response to the received light image; means for directing the said reflected light image from the object or surface upon each detector means; optical filter means disposed in front of each detector means, one corresponding to each of the differently colored regions of the object or surface being inspected; means for multiplying the said signals produced by each detector means by different corresponding weighting coefficients selected with coefficients of opposite positive/negative polarity for differently colored adjacent regions to optimize the signal contrast between the differently colored regions through maximizing the ratios between the various filter responses; and means for linearly summing the multiplied signals to create an electronically filtered resultant signal of sufficient signal contrast range to provide color discrimination irrespective of wide variation in light intensity and in color variation in the production of the object or surface.

8. Apparatus as claimed in claim 7 and in which means is provided for aligning the said reflected light images upon each detector means.

9. Apparatus as claimed in claim 7 and in which the plurality of detector means comprises electronic cameras, such as CCD cameras, of predetermined grey scale, and the corresponding optical filters therefor correspond to at least two differently colored regions of the object or surface to be differentiated in the inspection; the opposite positive/negative polarity weighting coefficients being selected to maximize the ratio between the filter spectral responses, with the said resultant signal creating a different grey scale image response containing color spectral information in the image processing and in an optimal manner that obviates illumination and other contrast constraints.

10. Apparatus as claimed in claim 7 and in which means is provided for identifying from said signals the material of the different inspected regions.

11. Apparatus as claimed in claim 9 and in which said object is food, the quality condition of which is one color and aberrations such as spoilage in which is another color; and the pair of optical filters is selected to correspond to said one and another colors.

12. Automatic inspection apparatus for differentiating differently colored regions of an object or surface illuminated by light reflected therefrom having, in combination, a plurality of separate light image detector means, such as scanning cameras for producing electronic signals in response to the received light image; means for directing the said reflected light image from the object or surface upon each detector means; optical filter means disposed in front of each detector means, one corresponding to each of the differently colored regions of the object or surface being inspected; means for multiplying the said signals produced by each detector means by different corresponding weighting coefficients selected to optimize the signal contrast between the different colors through maximizing the ratios between the various filter responses; and means for linearly summing the multiplied signals to create an electronically filtered resultant signal of sufficient signal contrast range to provide color discrimination irrespective of wide variation in light intensity and in color variation in the production of the object or surface, and in which the plurality of detector means comprises electronic cameras, such as CCD cameras, of predetermined grey scale, and the corresponding optical filters therefor correspond to at least two differently colored regions of the object or surface to be differentiated in the inspection; the weighting coefficients being selected to maximize the ratio between the filter spectral responses, with the said resultant signal creating a different grey scale image response containing color spectral information in the image processing and in an optimal manner that obviates illumination and other contrast constraints, and in which said object is a solid state wafer the conductor region of which is one color and the surrounding region is another color; and the optical filters are selected to correspond to said one and another colors.

13. Apparatus as claimed in claim 12 and in which said one color is gold and said another color is selected from the group consisting of substantially pink, blue and yellow color.

14. Apparatus as claimed in claim 13 and in which the weighting coefficients multiplying the signals from the respective cameras receiving gold filtered color and the filtered another color are about 19 and −39, respectively.

15. Automatic inspection apparatus for differentiating differently colored regions of an object or surface illuminated by light reflected therefrom having, in combination, a plurality of separate light image detector means, such as scanning cameras for producing electronic signals in response to the received light image; means for directing the said reflected light image from the object or surface upon each detector means; optical filter means disposed in front of each detector means, one corresponding to each of the differently colored regions of the object or surface being inspected; means for multiplying the said signals produced by each detector means by different corresponding weighting coefficients selected to optimize the signal contrast between the different colors through maximizing the ratios between the various filter responses; and means for linearly summing the multiplied signals to create an electronically filtered resultant signal of sufficient signal contrast range to provide color discrimination irrespective of wide variation in light intensity and in color variation in the production of the object or surface, and in which the plurality of detector means comprises electronic cameras, such as CCD cameras, of predetermined grey scale, and the corresponding optical filters therefor correspond to at least two differently colored regions of the object or surface to be differentiated in the inspection; the weighting coefficients being selected to maximize the ratio between the filter spectral responses, with the said resultant signal creating a different grey scale image response containing color spectral information in the image processing and in an optimal manner that obviates illumination and other contrast constraints, and in which said object is a printed circuit board the conductor region of which is copper color and the surrounding region of which is of another color; and the optical filters are selected to correspond to the conductor region and the surrounding region colors.

16. Apparatus as claimed in claim 15 and in which a further region adjacent the copper color conductor region comprises silver solder, with an optical filter provided for one of the detector means providing silver color filtering.

17. Automatic inspection apparatus for differentiating differently colored regions of an object or surface illuminated by light reflected therefrom having, in combination, a plurality of separate light image detector means, such as scanning cameras for producing electronic signals in response to the received light image; means for directing the said reflected light image from the object or surface upon each detector means; optical filter means disposed in front of each detector means; one corresponding to each of the differently colored regions of the object or surface being inspected; means for multiplying the said signals produced by each detector means by different corresponding weighting coefficients selected of opposite positive/negative polarity to optimize the signal contrast between the different colors through maximizing the ratios between the various filter responses; and means for linearly summing the multiplied signals to create an electronically filtered resultant signal of sufficient signal contrast range to provide color discrimination irrespective of wide variation in light intensity and in color variation in the production of the object or surface; and in which the plurality of detector means comprises electronic cameras, such as CCD cameras, of predetermined grey scale, and the corresponding optical filters therefor correspond to at least two differently colored regions of the object or surface to be differentiated in the inspection; the weighting coefficients being selected to maximize the ratio between the filter spectral responses, with the said resultant signal creating a different grey scale image response containing color spectral information in the image processing and in an optimal manner that obviates illumination and other contrast constraints; and in which the said object has a first region of one color and a surrounding region of another color; and the optical filters are selected to correspond to said first and another color.

18. A method of automatically inspecting and differentiating differently colored regions of an object or surface illuminated by light reflected therefrom, that comprises, independently receiving and electronically detecting reflected light images of the object or surface at a plurality of separate locations; providing different optical color filtering of the images at each location to produce from the detecting, different signals corresponding to the different spectral characteristics of the respective filtering; multiplying each of the said signals by different weighting coefficients selected of opposite positive/negative polarity to optimize the signal contrast between different colors; linearly summing the multiplied signals to create an electronically filtered resultant signal of sufficient signal contrast range to provide color discrimination irrespective of wide variation in light intensity and in color variation in the production of the object or surface, and in which the image receiving and detecting is effected at two scanning cameras each optically filtered with a different color corresponding to a different region of the object or surface that reflects the light with that color; and the weighting coefficient selection is effected to maximize the ratio between the responses of the filterings at the two cameras, and in which the object has a first region of one color and a surrounding region of another color; and the different color filtering is selected to correspond to the first region and the surrounding region colors.

* * * * *